United States Patent [19]

Hilbert et al.

[11] 3,743,863

[45] July 3, 1973

[54] TRANSISTORIZED ELECTRONIC CIRCUIT EMPLOYING RESISTORLESS BIAS NETWORK

[75] Inventors: Francis H. Hilbert, Addison; Arthur F. Seymour, Schaumburg, both of Ill.

[73] Assignee: Motorola, Inc., Franklin Park, Ill.

[22] Filed: Nov. 3, 1971

[21] Appl. No.: 195,335

[52] U.S. Cl. ................ 307/296, 307/255, 330/30 D
[51] Int. Cl. ........................................... H03k 17/00
[58] Field of Search.................. 307/296; 330/30 D, 330/69

[56] References Cited

UNITED STATES PATENTS 3,284,713 11/1966 Bailey ................................. 330/69

*Primary Examiner*—John W. Huckert
*Assistant Examiner*—B. P. Davis
*Attorney*—Vincent Rauner et al.

[57] ABSTRACT

Transistorized differential circuits include a biasing system that substantially reduces the need for resistors in the base circuits of the transistors being biased. An inductor coupled between the base of one of the transistors and a power supply forward biases the base-emitter junction of the transistor, and the other base is coupled to the same point of the power supply to bias the transistor so that the voltages at the bases of the transistors are substantially equal to each other, and are at substantially the voltage of the power supply to which the inductor is connected. This technique is applicable to balanced or unbalanced differential transistor circuits, and may be employed in amplifiers, mixers, limiters, multipliers and oscillators and in other small signal applications.

13 Claims, 3 Drawing Figures

TRANSISTORIZED ELECTRONIC CIRCUIT EMPLOYING RESISTORLESS BIAS NETWORK

BACKGROUND

This invention relates generally to biasing systems for transistors, and more particularly to transistor biasing systems having a minimum number of resistors for use with integrated circuits employing frequency selective elements or inductive coupling.

Several techniques for providing bias to a transistor are known. In one such system a transistor is biased through a resistive divider network in the base circuit. The current through the transistor, and hence its collector voltage, is determined by the ratio of the resistors in the base circuit, and by the amount of resistance in the emitter circuit. In another such system, the transistor is biased through a single resistor, having a high and relatively critical value, connected between the base of the transistor and the power supply.

Whereas these techniques provide useful ways to bias a transistor, there is a need, particularly in integrated circuit applications, for a system that provides transistor bias while minimizing the use of resistors, and that is substantially independent of transistor parameters, and operates at low voltage with minimum power consumption. It is particularly desirable to minimize the use of resistors in integrated circuits because of the relatively large amount of chip area required in the fabrication of resistors. Furthermore, it is desirable to eliminate resistors from integrated circuits to allow common isolation regions, minimize the number of bonding pads required, and to reduce operating power.

SUMMARY

Accordingly, it is an object of the present invention to provide a transistor biasing system that biases a transistor in a suitable operating region while minimizing the use of resistors.

It is another object of this invention to reduce the cost and complexity of integrated circuits through the use of a new biasing system for integrated circuits that minimizes the required silicon area, external components and bonding pads.

It is a further object of this invention to provide a biasing system that is particularly adaptable to integrated circuits employing reactive elements.

It is another object of this invention to provide transistor bias that is relatively independent of transistor parameters.

It is yet another object of this invention to provide a transistor biasing system that allows the operation of the transistor from a wide variety of voltages varying from low voltage power supplies such as one or two cell batteries having voltages on the order of 3 volts or less to supplies having voltages in excess of 12 volts.

In accordance with the preferred embodiment of the invention, transistor base bias voltages for a differential stage are obtained by connecting one base to a power supply through an input inductor and by connecting the other base to the same point on the power supply, thereby causing both transistors to have forward biased base-emitter junctions. The inductor provides substantially a short circuit for the direct current biasing voltages, thereby making the base voltages equal to each other and substantially equal to the supply voltage to which they are connected. At the same time, the inductors provide an electrical load to signal currents, thereby allowing a signal voltage to be impressed across the input inductor and subsequently amplified by the transistor to appear across an output load. The input inductor may be used alone or as part of a tuned circuit.

The instant biasing system is equally applicable for biasing amplifiers, mixers, limiters, multipliers, or other transistorized circuits.

DETAILED DESCRIPTION

Figure 1:
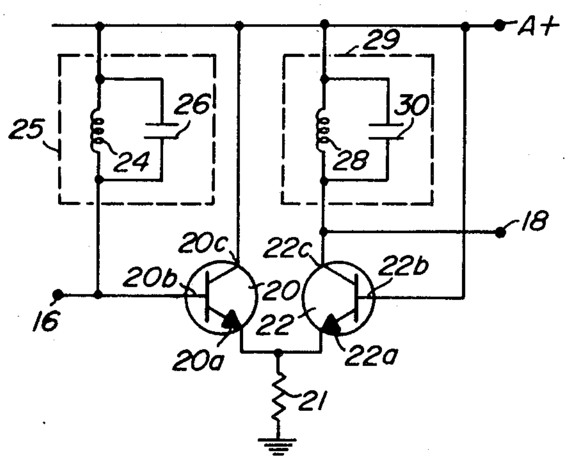
FIG. 1 is a circuit diagram of a differential stage biased according to the invention.

FIG. 1 shows a differential stage, including a pair of transistors 21 and 22, biased according to the invention. Although NPN transistors are shown, the invention is equally applicable to PNP transistors. Base 20b of transistor 20 is coupled to a power supply A+ through a load 25, comprising an inductor 24 and a capacitor 26, and collector 22*c* of transistor 22 is coupled to the power supply A+ through a load 29, comprising an inductor 28 and a capacitor 30. Although in a preferred embodiment, loads 25 and 29 comprise tuned circuits including inductors 24 and 28 and capacitors 26 and 30, loads 25 and 29 may include any circuit components that make the bias voltage at base 22*b* equal to the bias voltage at base 20b, both voltages being substantially equal to the power supply voltage. Stated another way, loads 25 and 29 have characteristics such that they sustain substantially no voltage across their terminals in response to bias current, but provide an electrical load to signals. Whereas these conditions imply a substantially resistorless network, it should be noted that circuits having small amounts of resistance may be used and still fall within the scope of the invention. Collector 20*c* of transistor 20 and base 22*b* of transistor 22 are connected directly to the power supply A+, thereby making the voltages at base 20*b* and base 22*b* equal to each other and substantially equal to the power supply voltage. The voltages at collectors 20*c* and 22*c* are also substantially equal to each other. While loads 25 and 29 are shown connected to base 20*b* and collector 22*c*, respectively, load 25 may be connected to either base and load 29 may be connected to either collector. The remaining base and collector may be connected directly to the power supply as shown to provide a single ended input and output, or similar loads may be employed in both bases and both collectors to provide balanced inputs and outputs. Emitters 20*a* and 22*a* are coupled to each other and to ground through resistor 21 to complete the bias circuit. Although resistor 21 is shown as the emitter load, a current source may be used in place of resistor 21 and still fall within the scope of the invention.

Since inductors 24 and 28 provide substantially no DC voltage across their terminals, the voltages at base 20*b* and base 22*b* will be substantially equal to the power supply voltage. The voltages at collectors 20*c* and 22*c* will be at or slightly below the power supply voltage. The base-emitter junctions of transistors 20 and 22 will be forward biased and the voltage at emitters 20*a* and 22*a* will be offset by one diode drop, or approximately 0.7 volts for silicon emitter-base junctions, from the base voltage.

Whereas capacitors 26 and 30 are not required for biasing transistors 20 and 22, they are used in applications where selectivity is required. If both the input tuned circuit comprising inductor 24 and capacitor 26 and the output tuned circuit comprising inductor 28 and capacitor 30 are tuned to a common frequency, the circuit will operate as an amplifier, and any signal applied to point 16 that is within the passband of the tuned circuit, will appear amplified at point 18. The maximum amplitude of any signal appearing at point 18 is determined by the amount of collector voltage swing available. Transistors 20 and 22 are normally biased with only one diode drop between collector 20*c* and emitter 20*a* (since bases 20*b* and 22*b* are biased at substantially the same voltage as collectors 20*c* and 22*c*) and between collector 22*c* and emitter 22*a*, the collector voltages can swing slightly less than one diode drop toward the emitters before saturation occurs. The tuned circuit load 29 comprising inductor 28 and capacitor 30 tends to make any AC collector swing symmetrical, thereby limiting the collector swing to one diode drop in the direction of increasing collector to emitter voltage. Hence, the maximum AC output signal that can appear at point 18 is limited to two diode drops, or approximately 1.4 volts peak to peak for silicon, thereby providing limiting action to signals larger than this value.

As described above, when the input and output tuned circuits are tuned to the same frequency, the circuit may be operated as either an amplifier or a limiter. The limiting action may be either saturation-type limiting as described in the foregoing, or may be current limiting wherein the maximum collector voltage swing is limited by the maximum current that is allowed to flow by resistor 21 or an emitter current source. In addition, if the output tuned circuit load 29 comprising inductor 28 and capacitor 30 is tuned to a higher frequency than the input tuned circuit load 25 comprising inductor 24 and capacitor 26, and in particular, if the output tuned circuit 29 is tuned to a frequency that is an integral multiple of the frequency to which the input tuned circuit 25 is tuned, the transistor circuit will operate as a multiplier having an output frequency that is related to the input frequency by the aforesaid integral multiple.

Since the voltages at the collectors and bases of transistors biased in this fashion will be substantially equal, any number of stages may be cascaded using a direct connection between the collector of one stage and the base of a succeeding stage. When transistors are cascaded in this fashion, the collector load of one transistor can be used simultaneously as the base impedance for the succeeding transistor. Hence, load 29 can serve a dual function of providing collector load for transistor 22 and a base bias impedance for a transistor (not shown) connected to point 18. Similarly, load 25 can provide both a base impedance for transistor 20 and a collector load for a transistor (not shown) connected to point 16.

Figure 2:
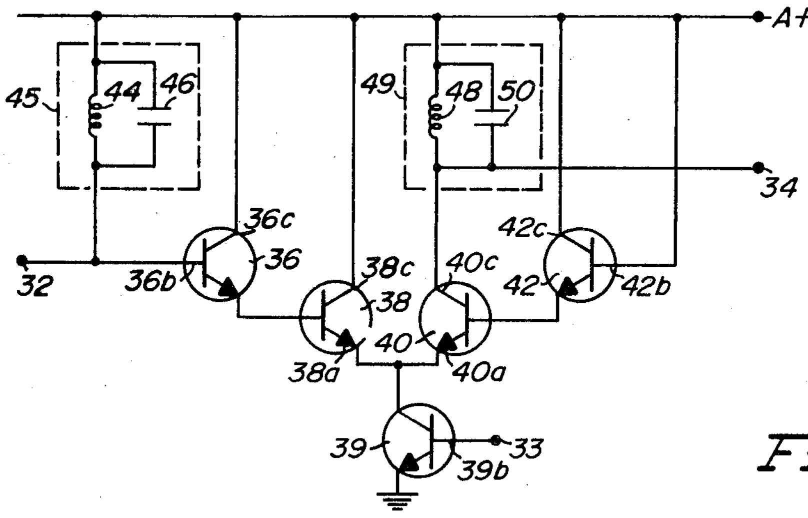
FIG. 2 is a circuit diagram of a Darlington connected differential circuit employing a current source transistor in the emitter circuit of the amplifier transistors biased according to the invention.

A variation of the differential circuit of FIG. 1 is shown in FIG. 2. The differential pair comprises two sets of coupled amplifier pairs including transistors 36, 38 and 40, 42. The collectors 40*c*, 42*c* of transistors 40, 42 may be coupled to the power supply as shown, or they may be connected directly to each other and coupled to the power supply through a common load similar to load 49 to provide a Darlington connection. The emitter load for the amplifier pairs consists of transistor 39. Base 36*b* of transistor 36 is coupled to the power supply A+ through a base impedance 45 and collector 40*c* of transistor 40 is coupled to the power supply A+ through an output load 49. The other base 42b of transistor 42 is connected directly to the power supply A+ as are the other collectors 36*c*, 38*c* and 42*c* of transistors 36, 38 and 42, respectively. As in the case of the circuit of FIG. 1, a load may be used in any of the collectors or bases that are connected to the power supply. Under these conditions the voltages at bases 36*b* and 42*b* and collectors 36*c*, 38*c*, 40*c* and 42*c* will be substantially equal to the power supply voltage. The advantages of using Darlington coupled transistors in the differential amplifier pair include a higher amplifier input impedance and a larger output voltage swing. The increased output voltage swing is obtained because emitters 38*a* and 40*a* are offset by two diode drops, or approximately 1.4 volts for silicon, from the power supply voltage instead of being offset only one diode drop as is the case of the circuit shown in FIG. 1. This allows collector 40*c* to swing a total of four diode drops, or about 2.8 volts peak to peak for silicon, thereby increasing the maximum AC signal that can appear at collector 40*c* to twice that of the circuit of FIG. 1. Collector 38*c* provides a similar voltage swing when a suitable load is connected to it.

When base 39*b* of the current source transistor 39 is connected to a suitable bias supply, the circuit of FIG. 2 may be operated as an amplifier, limiter or multiplier as in the case of the circuit of FIG. 1. In addition, when a current source such as, for example, transistor 39 is employed as an emitter impedance, an AC signal may be applied to input point 33 to vary the amount of current flowing through transistor 39. This makes the amount of current flowing through load 49 dependent on the signal at point 33 in addition to the voltage at input point 32. This characteristic allows the circuit of FIG. 3 to be used as a mixer. For example, if an AC signal is applied to input point 32 and a second AC signal is applied to point 33, the signal appearing at collector 40c will be an amplified reproduction of the signal at point 32 amplitude modulated by the signal at point 33. The tuned circuit, including inductor 48 and capacitor 50, may be tuned to any desired frequency component of the signal at collector 40*c*, thereby providing an output signal at point 34 having a frequency related to the sum or difference of the frequencies of the signals appearing at point 32 and 33. The AC signals may also be applied to other points in the circuit such as both to input point 32, or one to point 32 and one to base 42b or to other points and mixing action will still be achieved.

Figure 3:
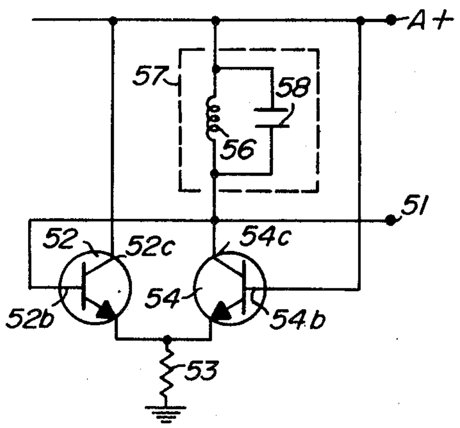
FIG. 3 is a circuit diagram of a two transistor oscillator biased according to the invention.

FIG. 3 shows a circuit diagram of a differential circuit, including transistors 52 and 54 therein, similar to the circuit shown in FIG. 1 having positive feedback to make it operate as an oscillator. As in the case of the amplifiers shown in FIGS. 1 and 2, bases 52*b* and 54*b* and collectors 52*c* and 54*c* of transistors 52 and 54, respectively, are connected to a power supply A+ either directly or through a load 57 which provides substantially no voltage drop thereacross in response to bias current and an electrical load to AC signals. This causes bases 52*b* and 54*b* and collectors 52*c* and 54*c* to operate at substantially the same voltage, thereby allowing collector 54*c* to be directly coupled to base 52*b* to provide positive feedback. This allows the circuit to oscillate at the frequency to which tuned circuit 57, including inductor 56 and capacitor 58, is tuned. The oscillator output signal may be obtained at output point 51, or alternately across a load similar to load 57 (not shown) which may be interposed between collector 52*c* and the power supply. Darlington coupled amplifier pairs and current source transistors similar to those used in the circuit of FIG. 2 may also be employed in the oscillator circuit of FIG. 3 and still be within the scope of the invention. In addition, a pair of low value resistors of equal value may be placed in series with bases 52*b* and 54*b* to improve the operation of the oscillator while maintaining bases 52*b* and 54*b* at substantially equal voltages and at substantially power supply voltage.

In summary, the biasing system according to the invention provides a reliable low cost and efficient means for biasing transistors, particularly for low voltage integrated circuit applications where reactive elements are used. The concepts of the present invention, by allowing the transistor to operate reliably with the base at approximately the same DC voltage as the power supply and with a low collector to emitter voltage, make it possible to operate a transistor stage from a wide range of power supply voltages, including one and two cell batteries and batteries of several volts. The reduction in the number of required resistors makes the circuits involved readily integratable, thereby providing low fabrication cost and compact size in addition to the aforementioned low voltage and low power requirements.

We claim:

1. A differential circuit energizable by direct current potential supply means having first and second terminals, including in combination, first and second transistor means each having input, output and common electrodes, common impedance means, means coupling said common electrodes to each other and to said first terminal of said direct current potential supply means through said common impedance means, and circuit means connected to at least one of said input and at least one of said output electrodes and to said second terminal of said direct current potential supply means, said circuit means providing a substantially resistance free connection between said second terminal and the electrodes connected thereto for applying a direct current potential substantially equal to the potential occurring at said second terminal of said power supply means to each of the input and output electrodes connected to said circuit means, said circuit means including reactance means connected to said one of said input and said one of said output electrodes and to said second terminal for sustaining alternating current signal voltages thereacross and substantially zero bias voltage thereacross in response to alternating current signal and bias current flow therethrough, the other input and output electrodes being directly connected to said second terminal.

2. A differential circuit usable for amplifying electrical signals and energizable by direct current potential supply means having first and second terminals, including in combination:

first and second transistor means each having input, output and common electrodes, common impedance means, and means coupling said common electrodes to each other and to said first terminal of said direct current potential supply means through said common impedance means;

input circuit means having first and second junctions and an alternating current impedance connected between said first and second junctions, said alternating current impedance providing a substantially resistance free connection between said first and second junctions, said first junction being connected directly to one of said input electrodes of one of said transistor means, said second junction of said input circuit means being connected directly to said second terminal of said power supply means; and output circuit means having first and second output circuit junctions and a second alternating current impedance connected between said first and second output circuit junctions, said second alternating current impedance providing a substantially resistance free connection between said first and second output circuit junctions, said first output circuit junction being connected directly to one of said output electrodes of one of said transistor means, said second output, circuit junction being connected directly to said second terminal of said power supply means the other input and output electrodes of said transistor means being connected directly to said second terminal of said power supply means.

3. A differential circuit as recited in claim 2 wherein said input circuit means includes an input inductor directly connected between said first and second junctions, and said output circuit means includes an output inductor directly connected between said first and second output circuit junctions.

4. A differential circuit as recited in claim 3 wherein said input circuit means and said output circuit means each include a capacitor connected in a parallel circuit with the respective inductor therein to provide an input frequency selective circuit and an output frequency selective circuit, respectively.

5. A differential circuit as recited in claim 4 wherein said input and said output frequency selective circuits are tuned to a common frequency.

6. A differential circuit as recited in claim 4 wherein said input and said output frequency selective circuits are tuned to different frequencies.

7. A differential circuit as recited in claim 2 wherein said common impedance means includes a resistor.

8. A differential circuit as recited in claim 2 wherein said first and second transistor means each includes a first and second transistor each having a base, collector and emitter, the emitter of said first transistor being connected to the base of said second transistor.

9. A differential circuit as recited in claim 2 wherein said common impedance means includes current source transistor means having base, collector and emitter electrodes, and bias means coupled to the potential supply means, said collector electrode of said current source transistor means being connected to said common electrodes of said transistor means for supplying current thereto, said emitter electrode of said current source transistor means being coupled to said first terminal of said power supply means, and said base electrode of said current source transistor being coupled to said bias means to control current flow through said current source transistor means.

10. A differential circuit as recited in claim 9 for use with first and second signal supply means, wherein said input circuit means is coupled to the first signal supply means receiving a first signal therefrom, and said base electrode of said current source transistor means is coupled to the second signal supply means receiving a second signal therefrom, said differential circuit providing output signals to said output circuit means in response to said first and second signals.

11. A differential circuit as recited in claim 1 wherein said input, output and common electrodes of said transistor means are base, collector and emitter electrodes, respectively.

12. A differential circuit as recited in claim 11 wherein each of said transistor means is a transistor.

13. A differential circuit as recited in claim 1 wherein each of said first and second transistor means includes a pair of transistors each having base, collector and emitter electrodes, the emitter electrode of one of the transistors of each pair being connected to the base of the other transistor of the pair, the other base, collector and emitter electrodes providing the input, output and common electrodes, respectively, for the transistor means.

* * * * *